United States Patent
Fierkens

[19]

[11] Patent Number: 6,000,901
[45] Date of Patent: Dec. 14, 1999

[54] APPARATUS FOR INDEXING MAGAZINES HOLDING MOLDED LEADFRAMES AND A METHOD THEREFOR

[75] Inventor: Richard H. J. Fierkens, Herwen, Netherlands

[73] Assignee: COFI International, Herwen, Netherlands

[21] Appl. No.: 09/084,466

[22] Filed: May 26, 1998

[51] Int. Cl.[6] .................................................. B65B 21/02
[52] U.S. Cl. ........................ 414/417; 414/609; 414/811; 198/467.1; 198/459.4
[58] Field of Search ......................... 414/331.13, 331.01, 414/609, 811, 417; 198/661, 467.1, 459.4, 675

[56] References Cited

U.S. PATENT DOCUMENTS

| | | | |
|---|---|---|---|
| 2,259,748 | 10/1941 | Hullhorst | 198/467.1 |
| 4,558,984 | 12/1985 | Garrett | 414/609 |
| 4,760,910 | 8/1988 | Suzuki et al. | 198/467.1 |
| 4,889,259 | 12/1989 | Lowrance et al. | 198/467.1 |
| 4,995,531 | 2/1991 | Summers | 198/467.1 |
| 5,120,189 | 6/1992 | Breda et al. | 198/467.1 |
| 5,516,251 | 5/1996 | Ichikawa | 414/331.13 |
| 5,588,791 | 12/1996 | Akagawa | 414/331.13 |
| 5,727,917 | 3/1998 | Fuke et al. | 414/331.13 |

*Primary Examiner*—Robert P. Olszewski
*Assistant Examiner*—Isobel A. Parker
*Attorney, Agent, or Firm*—Harry M. Weiss; Jeffrey Weiss; Paul W. Davis

[57] ABSTRACT

An apparatus and method are shown for indexing magazines and molded leadframes within the magazines comprising a lateral drive portion coupled to and located below the magazines for selectively moving a selected one of the magazines laterally at a first speed and for simultaneously moving the rest of the magazines laterally at a second speed, and a vertical drive portion having a portion for insertion into the selected one of the magazines when the magazines have ceased moving laterally for selectively moving the molded leadframes vertically within the selected one of the magazines. A plurality of magazine retaining members are also included each having a portion inserted into a portion of the lateral drive portion, and each having a cavity wherein a base portion of a corresponding one of the magazines rests. The lateral drive portion comprises a multi-pitch threaded shaft, a single motor coupled to the shaft for selectively rotating the shaft in either a clockwise or a counterclockwise direction, and a housing fitting over a portion of the shaft and having an aperture through a top surface portion thereof.

20 Claims, 2 Drawing Sheets

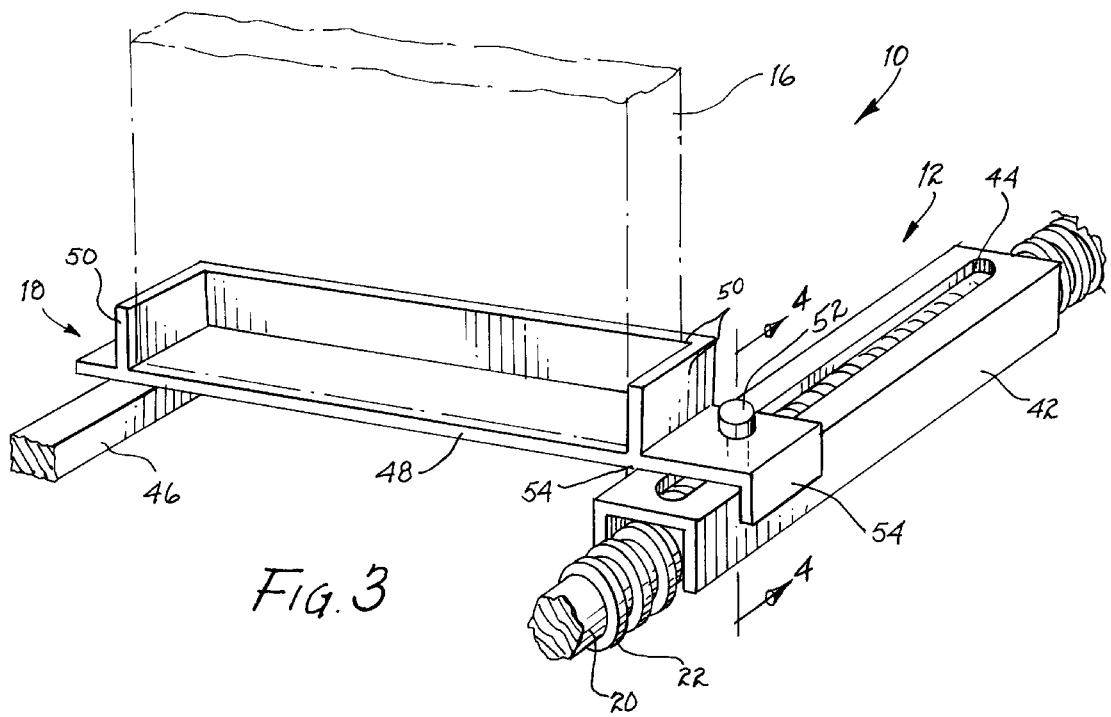
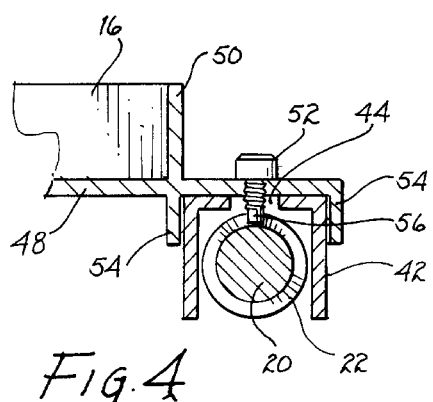

APPARATUS FOR INDEXING MAGAZINES HOLDING MOLDED LEADFRAMES AND A METHOD THEREFOR

BACKGROUND OF THE INVENTION

1. Field of the Invention

This invention is in the field of apparatus and methods for indexing magazines retaining molded leadframes and, more particularly, is an apparatus and method for laterally indexing such magazines and for vertically indexing the molded leadframes therein.

2. Description of the Related Art

A series of magazines is normally used to retain large numbers of molded leadframes until they are picked up by an apparatus for handling molded leadframes. Typically, such handling apparatus will pick up a molded leadframe from some point in a working space (i.e. the top of a stack of molded leadframes in a magazine) and deliver it to the top of a stack of molded leadframes in another magazine, or to a different location in which an operation is to be performed on the molded leadframe. Oftentimes, the point in space were the molded leadframe is picked up by the handling apparatus remains constant. In other words, each time that the handling apparatus goes to pick up a molded leadtrame from a magazine, it goes to the same position. Given this, when a molded leadframe is removed from the top of a stack of molded leadframes in a magazine, it is necessary that the stack be indexed upward by a dimension approximately equal to the thickness of one of the molded leadframes. In this manner, the handling apparatus can return each time to the same position in order to pick up the next molded leadframe off of the top of the stack.

The present invention provides a structure and a method for vertically indexing a stack of molded leadframes located in a magazine. In particular, after the top molded leadframe is removed from the stack by a molded leadframe handling apparatus, the vertical indexing structure moves the stack of molded leadframes in the magazine upward by a dimension approximately equal to the thickness of one of the molded leadframes. Note, that the vertical indexing structure can also be used to move a stack of molded leadframes in a magazine downward by a dimension approximately equal to the thickness of one of the molded leadframes. This later action would be required after a molded leadframe was dropped off by the molded leadframe handling apparatus onto the stack of molded leadframes in a magazine, and before the handling apparatus dropped off another molded leadframe onto the top of the same stack. This vertical indexing up or down of a stack of molded leadframes in a magazine permits the molded leadframe handling apparatus to pick up or to drop off, respectively, at the same relative position in a given magazine.

Whether molded leadframe handling apparatus are used to pick up or to drop off a molded leadframe at a specific magazine, if one has a number of such magazines arranged serially, it is necessary that there be sufficient space adjacent to the subject magazine so that the vertical indexing structure can access the molded leadframes therein. This equates to being able to move each magazine in a line of magazines into the desired operation position, one at a time, while leaving enough space to permit the vertical indexing structure to fit between the subject magazine and a magazine on the other side of the vertical indexing structure. In the past, a series of motions implemented by more than one motor were required in order to establish the requisite space next to the subject magazine. It would be advantageous to be able to establish the desired space next to the subject magazine by implementing only a single motor.

There existed a need to provide an apparatus and method, implementing only a single motor, to laterally index a line of magazines holding molded leadframes, one at a time, to an operating position along the line. Additionally, the lateral indexing of the magazines establishes enough space adjacent to a magazine in the operating position in order to permit a vertical indexing structure to fit next to this magazine. The vertical indexing structure moves the stack of molded leadframes in the magazine at the operating position up or down as required to keep the pick up or drop off position constant for a molded leadframe handling apparatus operating on the stack.

SUMMARY OF THE INVENTION

An object of the present invention is to provide an apparatus for indexing magazines and molded leadframes with the magazines and a method therefore.

Another object of the present invention is to provide an apparatus for indexing magazines holding molded leadframes laterally and bi-directionally using a single motor and a method therefore.

Yet another object of the present invention is to provide an apparatus using a single motor to laterally index magazines holding molded leadframes at two different speeds and a method therefore.

Still another object of the present invention is to provide an apparatus for vertically indexing molded leadframes within the magazines and a method therefore.

BRIEF DESCRIPTION OF THE PREFERRED EMBODIMENTS

According to the present invention, an apparatus for indexing magazines and molded leadframes within the magazines is disclosed comprising, in combination, lateral drive means coupled to and located below the magazines for selectively moving a selected one of the magazines laterally at a first speed and for simultaneously moving the rest of the magazines laterally at a second speed, and vertical drive means having a portion for insertion into the selected one of the magazines when the magazines have ceased moving laterally for selectively moving the molded leadframes vertically within the selected one of the magazines. Note that the first speed is greater than the second speed. The apparatus further includes a plurality of magazine retaining members each having a portion inserted into a portion of the lateral drive means and each having a cavity wherein a base portion of a corresponding one of the magazines rests.

Each magazine retaining member comprises a base member having a bottom surface portion at one end resting on a portion of the lateral drive means and having another bottom surface portion at an opposite end resting on a support member, a plurality of retaining members coupled to and extending upwardly from an upper surface portion of the base member forming the cavity, a plurality of clamping members coupled to and extending downwardly from a bottom surface portion of the base member, and a guide member threadedly engaged to the base member and having a pin extending into a portion of the lateral drive means. Note that one of the clamping members is adjacent to a first side portion of the lateral drive means and another of the clamping members is adjacent to an opposite side portion of the lateral drive means.

The lateral drive means comprises a multi-pitch threaded shaft, motor means coupled to the shaft for selectively rotating the shaft in one of a clockwise and counterclockwise direction, and a housing fitting over a portion of the shaft and having an aperture through a top surface portion thereof. A portion of each of the magazine retaining members extends through the aperture and fits between threads along the shaft. The multi-pitch threaded shaft provides first and second segments of thread having a first pitch, and a third segment of thread having a second pitch greater than the first pitch. The first segment of thread circumscribes the shaft beginning at a position in proximity to one end of the shaft and extending toward a midpoint of the shaft. Similarly, the second segment of thread circumscribes the shaft beginning at a position in proximity to an opposite end of the shaft and extending toward the midpoint of the shaft. The third segment of thread circumscribes a portion of the shaft between the first and second segments of thread.

Additionally, note that the third segment of thread is connected to the first and second segments of thread, and the first, second, and third segments of thread are continuous.

The vertical drive means comprises a lifting member having an L-shaped cross-section, and driver means coupled to the lifting member for inserting a portion of the lifting member into the selected one of the magazines when the magazines have ceased moving laterally, for moving the lifting member vertically, and for extracting the lifting member from the selected one of the magazines to a position above the magazines when the selected one of the magazines has been emptied of its molded leadframes.

In an alternative embodiment of the present invention, a method for indexing magazines and molded leadframes within the magazines is disclosed comprising the steps of providing lateral drive means coupled to and located below the magazines for selectively moving a selected one of the magazines laterally at a first speed and for simultaneously moving the rest of the magazines laterally at a second speed, and providing vertical drive means having a portion for insertion into the selected one of the magazines when the magazines have ceased moving laterally for selectively moving the molded leadframes vertically within the selected one of the magazines. Note that the first speed is greater than the second speed. This method further includes the step of providing a plurality of magazine retaining members each having a portion inserted into a portion of the lateral drive means and each having a cavity wherein a base portion of a corresponding one of the magazines rests.

The step of providing each magazine retaining member comprises the steps of providing a base member having a bottom surface portion at one end resting on a portion of the lateral drive means and having another bottom surface portion at an opposite end resting on a support member, providing a plurality of retaining members coupled to and extending upwardly from an upper surface portion of the base member forming the cavity, providing a plurality of clamping members coupled to and extending downwardly from a bottom surface portion of the base member, and providing a guide member threadedly engaged to the base member and having a pin extending into a portion of the lateral drive means. Note that one of the clamping members is adjacent to a first side portion of the lateral drive means and another of the clamping members is adjacent to an opposite side portion of the lateral drive means.

The step of providing the lateral drive means comprises the steps of providing a multi-pitch threaded shaft, providing motor means coupled to the shaft for selectively rotating the shaft in one of a clockwise and counterclockwise direction, and providing a housing fitting over a portion of the shaft and having an aperture through a top surface portion thereof. A portion of each of the magazine retaining members extends through the aperture and fits between threads along the shaft. The step of providing the multi-pitch threaded shaft includes the steps of providing first and second segments of thread having a first pitch, and providing a third segment of thread having a second pitch greater than the first pitch. The first segment of thread circumscribes the shaft beginning at a position in proximity to one end of the shaft and extending toward a midpoint of the shaft. Similarly, the second segment of thread circumscribes the shaft beginning at a position in proximity to an opposite end of the shaft and extending toward the midpoint of the shaft. The third segment of thread circumscribes a portion of the shaft between the first and second segments of thread. Additionally, note that the third segment of thread is connected to the first and second segments of thread, and the first, second, and third segments of thread are continuous.

The step of providing the vertical drive means comprises the steps of providing a lifting member having an L-shaped cross-section, and providing driver means coupled to the lifting member for inserting a portion of the lifting member into the selected one of the magazines when the magazines have ceased moving laterally, for moving the lifting member vertically, and for extracting the lifting member from the selected one of the magazines to a position above the magazines when the selected one of the magazines has been emptied of its molded leadframes.

The foregoing and other objects, features, and advantages of the invention will be apparent from the following, more particular, description of the preferred embodiments of the invention, as illustrated in the accompanying drawings.

BRIEF DESCRIPTION OF THE DRAWINGS

FIG. 3 is a simplified side perspective view showing part of the lateral drive portion. One of the magazine retaining members is shown coupled at one end to the lateral drive portion, and resting at an opposite end on a support member.

FIG. 4 is a cross-sectional view taken along the line 4—4 of FIG. 3 showing part of the lateral drive portion and part of a magazine retaining member.

DESCRIPTION OF THE PREFERRED EMBODIMENTS

Figure 1:
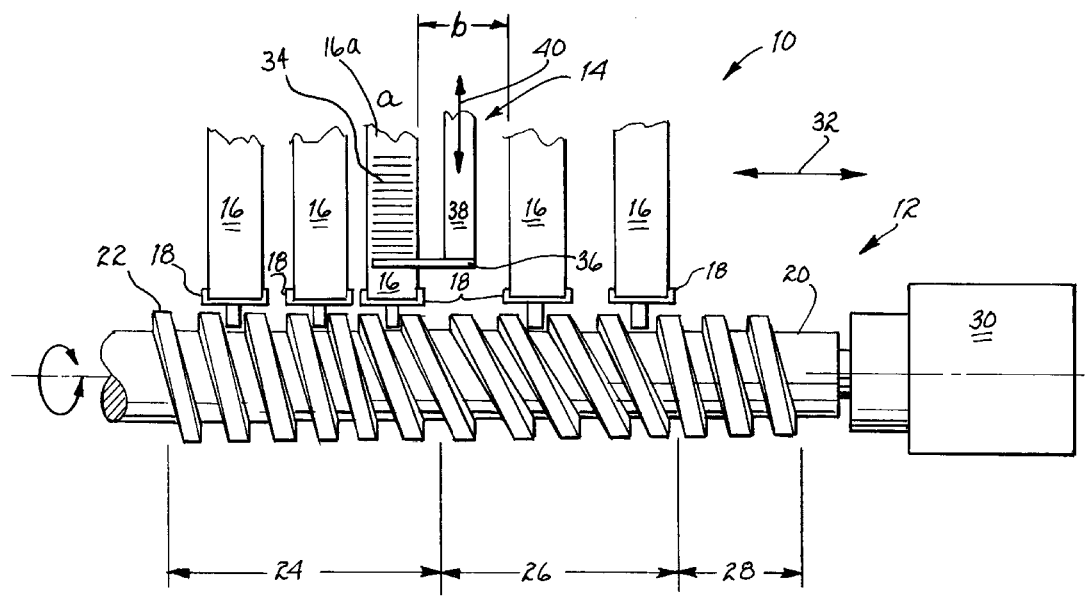
FIG. 1 is a simplified side perspective view showing part of the lateral and vertical drive portions of the instant invention.

Referring to FIG. 1, the apparatus for indexing magazines 16 and molded leadframes 34 within the magazines 16 is shown and generally designated by reference number 10 (hereafter more simply referred to as the apparatus). Note that for the sake of simplicity, only one of the magazines 16 is actually shown with a stack of molded leadframes 34 therein; however, it is generally the case that each of the magazines 16 shown in FIG. 1 would initially contain a stack of molded leadframes 34 therein. The word "initially" is used because oftentimes a magazine 16 holding a stack of molded leadframes 34 is unloaded one leadframe at a time by an external molded leadframe handling apparatus (not shown). In particular, the two right most magazines 16 in FIG. 1 have been emptied of their stack of molded leadframes 34, and the manner in which this occurs will be disclosed in the operation discussion below.

The simplified side perspective view depicted in FIG. 1 shows part of both the lateral 12 and vertical 14 drive portions of the apparatus 10. In particular, one will note that the lateral drive portion 12 also includes a housing 42 (see FIG. 3) which is not shown for simplification of the drawing here. The lateral drive portion 12 shown coupled to and located below the magazines 16 is for selectively moving a selected one 16a of the magazines 16 laterally at a first speed and for simultaneously moving the rest of the magazines 16 laterally at a second speed. The vertical drive portion 14 has a portion 36 for insertion into the selected one 16a of the magazines 16 when the magazines 16 have ceased moving laterally for selectively moving the stack of molded leadframes 34 vertically within the selected one 16a of the magazines 16.

Still with reference to FIG. 1, the apparatus 10 further includes a plurality of magazine retaining members 18 each having a portion inserted into a portion of the lateral drive portion 12 and each having a cavity wherein a base portion of a corresponding one of the magazines 16 rests. The lateral drive portion 12 comprises a multi-pitch threaded shaft 20 (or more simply the shaft 20), a motor 30 coupled to the shaft 20 for selectively rotating the shaft 20 in one of a clockwise and counterclockwise direction, and a housing 42 (see FIG. 3) fitting over a portion of the shaft 20 and having an aperture 44 (see FIG. 3) through a top surface portion thereof. Note that the motor 30 is supported relative to the ground (not shown) in any one of a number of manners well known to those skilled in the art. Moreover, the shaft 20 may be provided with any one of a number of different supports, such as a shaft bearing support, well known to those skilled in the art. The shaft 20 is referred to as threaded because it has grooves provided by a continuous thread 22 along the shaft 20. Moreover, the shaft 20 is referred to as multi-pitch because the thread 22 forms grooves having more than one pitch along the shaft 20. In particular, thread 22 provides first and second segments of thread, represented by threaded portions 24 and 28 respectively of shaft 20, each having a first pitch. Thread 22 also provides a third segment of thread, represented by threaded portion 26 of shaft 20, having a second pitch greater than the first pitch. The first segment of thread 24 circumscribes the shaft 20 beginning at a position in proximity to one end of the shaft 20 and extending toward a midpoint of the shaft 20. Similarly, the second segment of thread 28 circumscribes the shaft 20 beginning at a position in proximity to an opposite end of the shaft 20 and extending toward the midpoint of the shaft 20. Finally, the third segment of thread 26 circumscribes a portion of the shaft 20 between the first 24 and second 28 segments of thread. Note that the third segment of thread 26 is connected to the first 24 and second 28 segments of thread, and that the first 24, second 28, and third 26 segments of thread are continuous.

The apparatus 10, as depicted in FIG. 1, also includes the vertical drive portion 14 comprising a lifting member having an L-shaped cross-section, and a driver portion represented by the bi-directional arrow 40. The lifting member is actually comprised of members 36 and 38, which if viewed cross-sectionally, have the previously mentioned L-shape. The driver portion 40 is coupled to the lifting member 36 and 38 for inserting a portion 36 of the lifting member 36 and 38 into the selected one 16a of the magazines 16 when the magazines 16 have ceased moving laterally. When a portion of member 36 has been inserted into the selected one 16a of the magazines 16, the driver portion 40 moves the lifting member 36 and 38 vertically, thereby indexing the stack of molded leadframes 34 within the selected one 16a of the magazines 16 up or down, as desired. When there is no longer a need to vertically move the stack of molded leadframes 34 within the selected magazine 16a, such as when the selected magazine 16a is empty, the driver portion 40 extracts the lifting member 36 and 38 from the selected magazine 16a to a position above the magazines 16. Generally then, there are three motions executed by the driver portion 40, namely insertion of a portion of the member 36 into the selected magazine 16a, vertical motion of members 36 and 38, and extraction of member 36 from the selected magazine 16a. A variety of different driver mechanisms performing such motions are well known to those skilled in the art.

Figure 2:
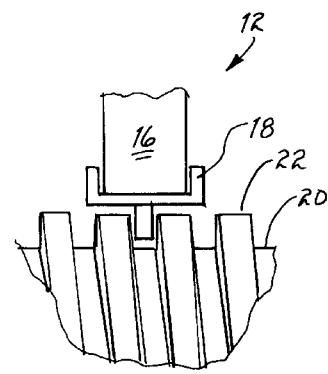
FIG. 2 is a simplified side perspective view partially showing the shaft of the lateral drive portion. Note that one of the magazine retaining members is partially shown with a portion thereof fitting between threads along the shaft.

Referring to FIG. 2, a simplified side perspective view partially shows the shaft 20 of the lateral drive portion 12. Note that one of the magazine retaining members 18 is partially shown with a portion thereof fitting between threads 22 along the shaft 20. One also notices that the magazine retaining member 18 forms a cavity within which a portion of one of the magazines 16 rests.

Referring to FIG. 3, a simplified side perspective view shows part of the lateral drive portion 12 (the motor 30 of FIG. 1 is not shown here for simplification of the drawing). Additionally, one of the magazine retaining members 18 is shown coupled at one end to the lateral drive portion 12, and resting at an opposite end on a support member 46. Note that FIG. 3 only shows a single magazine 16 and magazine retaining member 18 for simplification of the drawing, but in practice, a plurality of each 16 and 18 would be used, as shown in FIG. 1.

Referring to FIGS. 3 and 4, each magazine retaining member 18 comprises a base member 48 having a bottom surface portion at one end resting on a portion of the lateral drive portion 12 and having another bottom surface portion at an opposite end resting on the support member 46, a plurality of retaining members 50 coupled to and extending upwardly from an upper surface portion of the base member 48 forming a cavity, a plurality of clamping members 54 coupled to and extending downwardly from a bottom surface portion of the base member 48, and a guide member 52 threadedly engaged to the base member 48 and having a pin 56 extending into a portion of the lateral drive portion 12. In particular, the pin 56 of each of the magazine retaining member 18 extends through the aperture 44 and fits between threads 22 along the shaft 20. Additionally, note that in FIG. 3, only three of the retaining members 50 are shown for simplification of the drawing; however, in the preferred embodiment of the apparatus 10, four retaining members 50 are implemented, as suggested by comparing both FIGS. 1 and 3 together. Moreover, one of the clamping members 54 is adjacent to a first side portion of the lateral drive portion 12 and another of the clamping members 54 is adjacent to an opposite side portion of the lateral drive portion 12. Recall that the base member 48 has a bottom surface portion at one end resting on a portion of the lateral drive portion 12 (i.e. the housing 42). The housing 42 is preferably fixed to the ground (not shown) so that it does not slide as the magazine retaining members 18 slide over the fixed housing 42. Similarly, the support member 46 is preferably fixed to the ground (not shown) so that it does not slide as the magazine retaining members 18 slide over the fixed support member 46. The support member 46 and housing 42 may be fixed to the ground (not shown) in any one of a number of ways well known to those skilled in the art.

OPERATION

Referring to FIG. 1, a plurality of magazines 16 are shown. Initially, each magazine 16 contains a stack of molded leadframes 34. Generally, the apparatus 10 is designed to selectively move the magazines 16 along the lateral drive portion 12. The term "selectively move" means that the motor 30 can produce one of three results. First, the motor 30 shaft can be non-rotating, and therefore, the shaft 20 would also be non-rotating. As a result, the magazines 16 remain stationary. Second, the motor 30 shaft can rotate in a clockwise direction, thereby rotating shaft 20 in a clockwise direction. Accordingly, the magazines 16 would move in one lateral direction along the shaft 20 since the magazine retaining members 18 each retain a magazine 16, each have a pin 56 (see FIG. 4) engaged between the threads 22 of the shaft 20, and each magazine retaining member 18 slides across the support member 46 (see FIG. 3). Third, the motor 30 shaft can rotate in a counterclockwise direction, thereby rotating shaft 20 in a counterclockwise direction. Thus, the magazines 16 would move in an opposite lateral direction along the shaft 20 since the magazine retaining members 18 each retain a magazine 16, each have a pin 56 (see FIG. 4) engaged between the threads 22 of the shaft 20, and each magazine retaining member 18 slides across the support member 46 (see FIG. 3). In summary, depending upon the condition of the motor 30, the magazines 16 are either stationary, or moving laterally to the left or right, as represented by the bidirectional arrow 32 in FIG. 1.

Given this, the magazines 16 are initially each filled with a stack of molded leadframes 34, and the magazines 16 would be located along shaft 20, but to the left of the third segment of thread 26. Next, the motor 30 would be rotated to move the 42. magazines 16 to the right at the second speed along the shaft 20 until the first magazine 16, the selected magazine 16a, reaches position "a" along the shaft 20. With the selected magazine 16a in position "a," the motor 30 would cease rotating shaft 20 and all of the magazines 16 would come to rest. Note that the term "selected magazine" simply refers to magazine 16a which is in position "a" along the shaft 20. However, also note that those skilled in the art recognize that other positions along the shaft 20 could be implemented as position "a." The position "a" simply refers to a position along the shaft 20 adjacent to a space "b" (see FIG. 1) where the vertical drive portion 14 is situated relative to the lateral drive portion 12.

Next, the vertical drive portion 14 would be lowered from an initial position above the magazines 16 to a position in which the member 36 could be inserted into the selected magazine 16a. With the member 36 inserted into the selected magazine 16a, the vertical drive portion 14 would selectively raise the stack of molded leadframes 34 within the selected magazine 16a by a dimension approximately equal to the thickness of one of the molded leadframes each time an external molded leadframe handling apparatus (not shown) removed the top molded leadframe from the stack 34. Given this vertical indexing of the stack of molded leadframes 34, the external molded leadframe handling apparatus would be able to pick up the top molded leadframe from the stack 34 each time from the same position relative to the selected magazine 16a. When each of the molded leadframes have been removed from the stack of molded leadframes 34 in the selected magazine 16a, the vertical drive portion 14 would be extracted from the selected magazine 16a to a position above the magazines 16. Note that there are various mechanisms for moving the vertical drive portion 14 in the manner disclosed, and any one of these various mechanisms, which are well known to those skilled in the art, could be implemented.

With the vertical drive portion 14 now situated above the magazines 16, the motor 30 would again rotate to shift the magazines 16 to the right. The first emptied magazine 16 (i.e. the first "selected magazine 16a") now enters that portion of the shaft 20 circumscribed by the third segment of thread 26 while the other magazines 16 are still over that portion of the shaft 20 circumscribed by the first segment of thread 24. Since the pitch associated with the third segment of thread 26 is greater than the pitch associated with the first segment of thread 24, the first emptied magazine 16, now entering the third segment of thread 26, moves across the shaft 20 at a greater speed (i.e. the first speed) than the speed (i.e. the second speed) that the other magazines 16, situated over the first segment of thread 24, traverse the shaft 20. When the next "selected magazine" 16a reaches position "a," the first "selected magazine" 16a (now empty) has traversed position "b." Thus, with the new "selected magazine" 16a in position "a" and the previous "selected magazine" 16a immediately to the right of position "b," the space required at position "b" for the vertical drive portion 14 to engage the new "selected magazine" 16a exists. Then, the vertical drive portion 14 would engage the newly "selected magazine" 16a to selectively index its stack of molded leadframes 34 vertically as previously discussed, and the process continues in like fashion until all of the magazines 16 have been emptied of their molded leadframes and moved toward the right side of the shaft 20.

Having now discussed the operation of the apparatus 10, it is evident why the shaft 20 is referred to as being "multi-pitch." Simply stated, the shaft 20 includes threaded segments 24–28 having more than one pitch between them. In particular, the first 24 and second 28 segments of thread have a first pitch which is less than the pitch of the third segment of thread 26. In this manner, rotation of the shaft 20, causes magazines 16 over the third segment of thread 26 to move more rapidly across the shaft 20, thereby establishing and maintaining the space required at position "b" for the vertical drive portion 14 to engage the "selected magazine" 16a at position "a." The second segment of thread 28 has a pitch less than the pitch of the third segment of thread 26 in order to limit the required length of the shaft 20 to handle a given number of magazines 16. In other words, one could imagine the shaft 20 comprised of only the first 24 and the third 26 segments of thread, but this would necessitate a longer shaft 20 for a given number of magazines 16 because empty magazines 16 would exit position "a" at the elevated first speed, and continue at that speed every time the shaft 20 was rotated. This would be an undesirable result, therefore the shaft 20 has the first 24 and second 28 segments of thread of lower pitch located on opposite sides of the third segment of thread 26.

Those skilled in the art recognize that the length of the shaft 20 can be altered to accommodate a larger number of magazines 16 than shown in FIG. 1. It is also important to remember that the desired spacing at position "b" is created by moving the magazines 16 along the shaft 20, as discussed above, using only a single motor 30.

Although the invention has been particularly shown and described with reference to a preferred embodiment thereof, it will be understood by those skilled in the art that changes in form and detail may be made therein without departing from the spirit and scope of the invention. For example, those skilled in the art recognize that there are a number of different control systems available to control the operation of the vertical drive portion 14, and the motor 30 of the lateral drive portion 12, as discussed above. Additionally, note that the operation of the apparatus 10, as discussed above, refers to the case where the magazines 16 are initially full of molded leadframes and move from the left to right across the shaft 20; however, those skilled in the art appreciate that it is within the scope of the claimed invention to move the magazines 16 in the opposite direction. In particular, in order to operate the apparatus 10 analogously to the manner discussed above, but with the magazines 16 moving right to left, the motor 30 need only rotate in the opposite direction from that discussed above, and the member 36 of the vertical drive portion 14 would need to extend to the right, instead of to the left (as shown in FIG. 1), in the L-shaped configuration. Lastly, note that while the vertical drive portion 14 has been shown to vertically lift a stack of molded leadframes 34, those skilled in the art recognize that it could be implemented with the lateral drive portion 12 to vertically lower a stack of molded leadframes 34 within a magazine 16. This would be needed, for example, for a magazine 16 for which an external molded leadframe handling apparatus (not shown) was placing molded leadframes one at a time on top of the stack 34.

What is claimed is:

1. An apparatus for indexing magazines and molded leadframes within said magazines comprising, in combination:
    lateral drive means coupled to and located below said magazines for selectively moving a selected one of said magazines laterally at a first speed and for simultaneously moving the rest of said magazines laterally at a second speed; and
    vertical drive means having a portion for insertion into said selected one of said magazines when said magazines have ceased moving laterally for selectively moving said molded leadframes vertically within said selected one of said magazines.

2. The apparatus of claim 1 further including a plurality of magazine retaining members each having a portion inserted into a portion of said lateral drive means and each having a cavity wherein a base portion of a corresponding one of said magazines rests.

3. The apparatus of claim 2 wherein each magazine retaining member comprises:
    a base member having a bottom surface portion at one end resting on a portion of said lateral drive means and having another bottom surface portion at an opposite end resting on a support member;
    a plurality of retaining members coupled to and extending upwardly from an upper surface portion of said base member forming said cavity;
    a plurality of clamping members coupled to and extending downwardly from a bottom surface portion of said base member; and
    a guide member threadedly engaged to said base member and having a pin extending into a portion of said lateral drive means.

4. The apparatus of claim 3 wherein one of said clamping members is adjacent to a first side portion of said lateral drive means and another of said clamping members is adjacent to an opposite side portion of said lateral drive means.

5. The apparatus of claim 2 wherein said lateral drive means comprises:
    a multi-pitch threaded shaft;
    motor means coupled to said shaft for selectively rotating said shaft in one of a clockwise and counterclockwise direction; and
    a housing fitting over a portion of said shaft and having an aperture through a top surface portion thereof.

6. The apparatus of claim 5 wherein a portion of each of said magazine retaining members extends through said aperture and its between threads along said shaft.

7. The apparatus of claim 5 wherein said multi-pitch threaded shaft provides first and second segments of thread having a first pitch, and a third segment of thread having a second pitch greater than said first pitch.

8. The apparatus of claim 7 wherein said first segment of thread circumscribes said shaft beginning at a position in proximity to one end of said shaft and extending toward a midpoint of said shaft, wherein said second segment of thread circumscribes said shaft beginning at a position in proximity to an opposite end of said shaft and extending toward said midpoint of said shaft, wherein said third segment of thread circumscribes a portion of said shaft between said first and second segments of thread, wherein said third segment of thread is connected to said first and second segments of thread, and wherein said first, second, and third segments of thread are continuous.

9. The apparatus of claim 1 wherein said vertical drive means comprises:
    a lifting member having an L-shaped cross-section; and
    driver means coupled to said lifting member for inserting a portion of said lifting member into said selected one of said magazines when said magazines have ceased moving laterally, for moving said lifting member vertically, and for extracting said lifting member from said selected one of said magazines to a position above said magazines when said selected one of said magazines has been emptied of its molded leadframes.

10. The apparatus of claim 1 wherein said first speed is greater than said second speed.

11. A method for indexing magazines and molded leadframes within said magazines comprising the steps of:
    providing lateral drive means coupled to and located below said magazines for selectively moving a selected one of said magazines laterally at a first speed and for simultaneously moving the rest of said magazines laterally at a second speed; and
    providing vertical drive means having a portion for insertion into said selected one of said magazines when said magazines have ceased moving laterally for selectively moving said molded leadframes vertically within said selected one of said magazines.

12. The method of claim 11 further including the step of providing a plurality of magazine retaining members each having a portion inserted into a portion of said lateral drive means and each having a cavity wherein a base portion of a corresponding one of said magazines rests.

13. The method of claim 12 wherein the step of providing each magazine retaining member comprises the steps of:
    providing a base member having a bottom surface portion at one end resting on a portion of said lateral drive means and having another bottom surface portion at an opposite end resting on a support member;
    providing a plurality of retaining members coupled to and extending upwardly from an upper surface portion of said base member forming said cavity;
    providing a plurality of clamping members coupled to and extending downwardly from a bottom surface portion of said base member; and
    providing a guide member threadedly engaged to said base member and having a pin extending into a portion of said lateral drive means.

14. The method of claim 13 wherein one of said clamping members is adjacent to a first side portion of said lateral drive means and another of said clamping members is adjacent to an opposite side portion of said lateral drive means.

15. The method of claim 12 wherein the step of providing said lateral drive means comprises the steps of:

provide a multi-pitch threaded shaft;

providing motor means coupled to said shaft for selectively rotating said shaft in one of a clockwise and counterclockwise direction; and providing a housing fitting over a portion of said shaft and having an aperture through a top surface portion thereof.

16. The method of claim 15 wherein a portion of each of said magazine retaining members extends through said aperture and fits between threads along said shaft.

17. The method of claim 15 wherein the step of providing said multi-pitch threaded shaft includes the steps of providing first and second segments of thread having a first pitch, and providing a third segment of thread having a second pitch greater than said first pitch.

18. The method of claim 17 wherein said first segment of thread circumscribes said shaft beginning at a position in proximity to one end of said shaft and extending toward a midpoint of said shaft, wherein said second segment of thread circumscribes said shaft beginning at a position in proximity to an opposite end of said shaft and extending toward said midpoint of said shaft, wherein said third segment of thread circumscribes a portion of said shaft between said first and second segments of thread, wherein said third segment of thread is connected to said first and second segments of thread, and wherein said first, second, and third segments of thread are continuous.

19. The method of claim 11 wherein the step of providing said vertical drive means comprises the steps of:

providing a lifting member having an L-shaped cross-section; and providing driver means coupled to said lifting member for inserting a portion of said lifting member into said selected one of said magazines when said magazines have ceased moving laterally, for moving said lifting member vertically, and for extracting said lifting member from said selected one of said magazines to a position above said magazines when said selected one of said magazines has been emptied of its molded leadframes.

20. The method of claim 11 wherein said first speed is greater than said second speed.

* * * * *